(12) United States Patent
Casey et al.

(10) Patent No.: US 7,119,563 B2
(45) Date of Patent: Oct. 10, 2006

(54) INTEGRATED CIRCUIT CHARACTERIZATION PRINTED CIRCUIT BOARD

(75) Inventors: William J. Casey, Boise, ID (US); David R. Cuthbert, Meridian, ID (US); Olivia I. McGrew, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/142,226

(22) Filed: Jun. 1, 2005

(65) Prior Publication Data

US 2005/0206400 A1    Sep. 22, 2005

Related U.S. Application Data

(63) Continuation of application No. 10/405,940, filed on Apr. 2, 2003.

(51) Int. Cl.
*G01R 31/02* (2006.01)

(52) U.S. Cl. ..................................... 324/754

(58) Field of Classification Search ............... 324/754, 324/760, 763, 761, 765, 158.1, 755, 762; 174/262–266, 255–258; 361/792, 794–795; 439/66–72
See application file for complete search history.

(56) References Cited

U.S. PATENT DOCUMENTS

| | | | |
|---|---|---|---|
| 5,661,409 A | 8/1997 | Mohsen | |
| 5,801,440 A | 9/1998 | Chu et al. | |
| 5,898,576 A | 4/1999 | Lockwood et al. | |
| 5,999,437 A * | 12/1999 | Chengson et al. | 365/52 |
| 6,037,044 A * | 3/2000 | Giri et al. | 428/209 |
| 6,048,755 A | 4/2000 | Jiang et al. | |
| 6,127,834 A | 10/2000 | Eliashberg et al. | |
| 6,232,564 B1 | 5/2001 | Arudt et al. | |
| 6,246,015 B1 | 6/2001 | Kim | |
| 6,329,603 B1 * | 12/2001 | Japp et al. | 174/255 |
| 6,359,452 B1 * | 3/2002 | Mozzetta | 324/754 |
| 6,418,032 B1 | 7/2002 | Hirata et al. | |
| 6,458,611 B1 | 10/2002 | Gardner | |
| 6,462,570 B1 * | 10/2002 | Price et al. | 324/754 |
| 6,469,530 B1 | 10/2002 | Johnson et al. | |
| 6,511,347 B1 | 1/2003 | Chapman et al. | |
| 6,545,497 B1 * | 4/2003 | Hebert et al. | 324/765 |
| 2002/0108778 A1 | 8/2002 | Dishongh et al. | |

* cited by examiner

*Primary Examiner*—Ha Tran Nguyen
*Assistant Examiner*—Tung X. Nguyen
(74) *Attorney, Agent, or Firm*—TraskBritt (57) ABSTRACT

An integrated circuit characterization printed circuit board and method are provided for improving the uniformity of impedance introduced by a test fixture across all of the pins of an integrated circuit device. The printed circuit board includes an array of substantially similar test contacts numbering greater than the pins of the integrated circuit device. The array of test contacts includes an active portion configured for electrically coupling with the corresponding pins on the integrated circuit device and an inactive portion adjacent to the active portion and electrically coupled to a reference signal on the printed circuit board.

7 Claims, 8 Drawing Sheets

INTEGRATED CIRCUIT CHARACTERIZATION PRINTED CIRCUIT BOARD

CROSS-REFERENCE TO RELATED APPLICATION

This application is a continuation of application Ser. No. 10/405,940, filed Apr. 2, 2003, pending.

BACKGROUND OF THE INVENTION

1. Field of the Invention

The present invention relates generally to the field of integrated circuit testing. More particularly, the present invention relates to the field of coupling integrated circuit devices to test equipment for device characterization.

2. State of the Art

Development of new integrated circuit devices includes performance characterization of the devices for design integration purposes and for the publication of data sheet specifications relating to the integrated circuit device. Conventional characterization of an integrated circuit device has utilized a socket or other reusable coupling device for receiving the integrated circuit device-under-characterization. However, the utilization of a socket for characterization of an integrated circuit device introduces significant mechanical coupling to the electrical contacts of the integrated circuit device-under-test. Such an introduction of an extensive mechanical interface further introduces significant electrical impedance contributions to the characterization process that yet requires inherent characterization of the introduced socket components. Generally, viewing an integrated circuit device through a socket in and of itself requires significant characterization of the socket. Additionally, a reusable mechanical coupling device, such as a socket, introduces further characterization variations due to the nonrepeatable coupling nature resulting in inconsistent socket contact pressure and alignment as well as integrated circuit device pin orientation variations.

With regard to former socket characterization approaches, the semiconductor testing discipline has yet to reach a consensus on a representative test methodology for characterization of a socket. For example, some socket characterization methodologies utilize a shorting plate for determining the characteristic impedance of the socket while other approaches advocate an open-circuit methodology wherein the socket pins are open-circuited and electrically driven with a variable signal while searching for a resonant frequency from which the impedance may be calculated. Therefore, the socket impedance calculation according to accepted methodologies for socket characterization is grossly approximate at best. Therefore, it would be desirable to characterize an integrated circuit device in an environment that minimizes the introduction of extraneous impedance-contributing structures as well as provides a consistent contact characterization environment for multiple pins of a multipin integrated circuit device.

BRIEF SUMMARY OF THE INVENTION

An integrated circuit characterization printed circuit board is provided for improving the uniformity of impedance introduced by a test fixture across all of the contacts or pins of an integrated circuit device. In one embodiment of the present invention, a printed circuit board is provided for mechanically and electrically coupling between an integrated circuit device-under-characterization and the respective test equipment. The printed circuit board includes an array of substantially similar test contacts numbering greater than the pins of the integrated circuit device. The array of test contacts includes (i) an active portion configured for electrically coupling with the corresponding pins on the integrated circuit device and (ii) an inactive portion adjacent to the active portion and electrically coupled to a reference signal on the printed circuit board.

In another embodiment of the present invention, a method for manufacturing the printed circuit board is provided by forming the structures, including the substantially similar contact pins of both the active and inactive portions. Additionally, a method of characterizing an integrated circuit device is provided including forming the printed circuit board, coupling the integrated circuit device to the printed circuit board and subjecting the combined assembly to the test equipment signals.

In yet a further embodiment, a test system for characterizing an integrated circuit is provided by electrically coupling a printed circuit board that provides uniformity of impedance to all contact pins on an integrated circuit undergoing characterization. The printed circuit board is electrically coupled to test equipment for the performance of a characterization test of an integrated circuit device.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention provides a method and circuit for more closely standardizing the electrical conditions presented to pins or contacts of an integrated circuit device that is undergoing a characterization process for determining the performance and capabilities of the integrated circuit device. As mentioned, prior approaches utilized less-repeatable coupling mechanisms (e.g., sockets) for interfacing between an integrated circuit device-under-characterization and the associated test equipment. The various embodiments of the present invention facilitate a more uniform environment to minimize introduced extraneous impedance components associated with providing the interface between the integrated circuit device and the test equipment.

Figure 1:
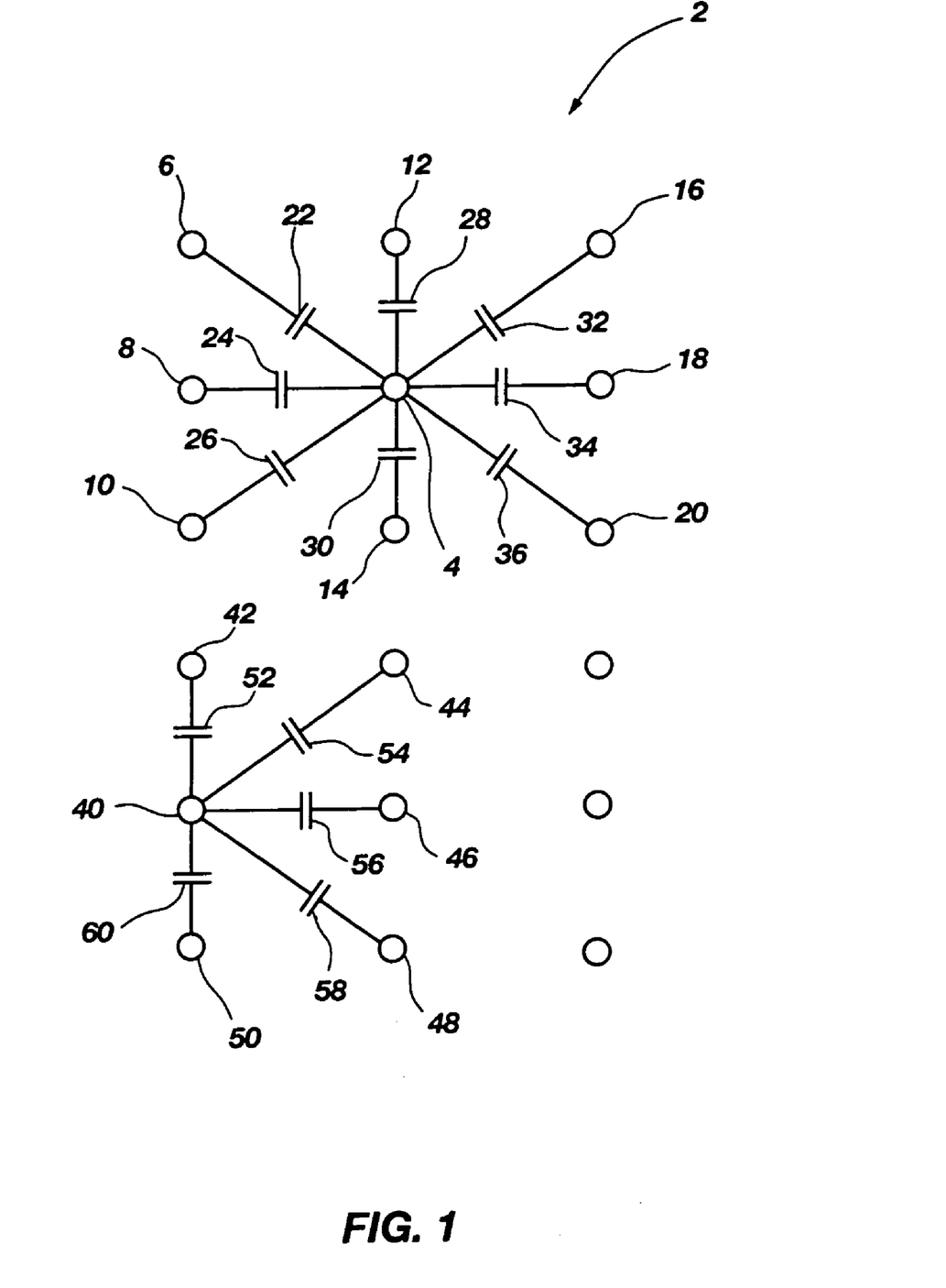
FIG. 1 illustrates interrelated capacitances of an array of contact pads on a printed circuit board.

FIG. 1 illustrates an array of contact pads on a printed circuit board (PCB), and a portion of the contact pad capacitances of representative pads, resulting from the configuration of the array. An array of contact pads 2 is illustrated as a single combined array; however, for purposes of illustration of the associated capacitances, two individual contact pads 4, 40 of the array of contact pads 2 are illustrated with two contact pad groupings, a first group surrounding contact pad 4 and a second group surrounding contact pad 40. FIG. 1 illustrates each of the contact pads of the array of contact pads 2 as being "active" contact pads. As used herein, "active" contact pads means pads that couple or are for coupling with corresponding pins, leads or contacts (hereinafter "pins") of an integrated circuit device. Furthermore, as used herein, "inactive" contact pads means contact pads that are present as part of the array of contact pads, but are not arranged for placement or coupling to pins of the integrated circuit device. Furthermore, as used herein, the term "integrated circuit device" includes not only memory devices but also microprocessors, signal processors and other forms of integrated circuits.

In FIG. 1, a contact pad 4 is illustrated as being surrounded by other contact pads 6–20, which are also illustrated as being active contact pads for further coupling with pins of an integrated circuit device. It is appreciated by those of ordinary skill in the art that the coupling of a PCB to an integrated circuit device for the characterization process of, for example, the capacitance associated with contact pad 4 introduces additional capacitance as seen by contact pad 4. By way of example, FIG. 1 illustrates capacitances 22–36 resulting from the respective adjacent orientation of contact pads 6–20 which surround active contact pad 4. Those of ordinary skill in the art appreciate that the capacitance measured at contact pad 4 prior to the coupling of the integrated circuit device therewith varies significantly from the resultant capacitance as seen at active contact pad 4 once the integrated circuit device has been coupled therewith.

Similarly, active contact pad 40 of FIG. 1 is partially surrounded by other active contact pads 42–50 which exhibit respective capacitances 52–60 as seen at active contact pad 40. As illustrated, however, the capacitances as observed at active contact pad 4 and active contact pad 40 differ significantly. Therefore, characterization of any integrated circuit device coupled therewith results in an individualized characterization of the extraneous capacitances as observed at various active contact pads, for example, active contact pads 4 and 40. Therefore, it would be desirable to define a structure and method capable of providing a more uniform interface between an integrated circuit device-under-characterization and the respective test equipment to provide improved uniformity across the active contact pads of the array of contact pads 2.

An embodiment of the present invention provides a more uniformly introduced impedance across each of the active contact pads in the array of active contact pads. This uniformity improves the ability to characterize the impedance introduced by the coupling mechanism (e.g., the PCB) between the integrated circuit device and the test equipment, thereby simplifying the removal of the PCB-introduced impedance when characterizing the performance of the integrated circuit device individually, such as, for example, for reporting in integrated circuit device data sheets.

Figure 2A:
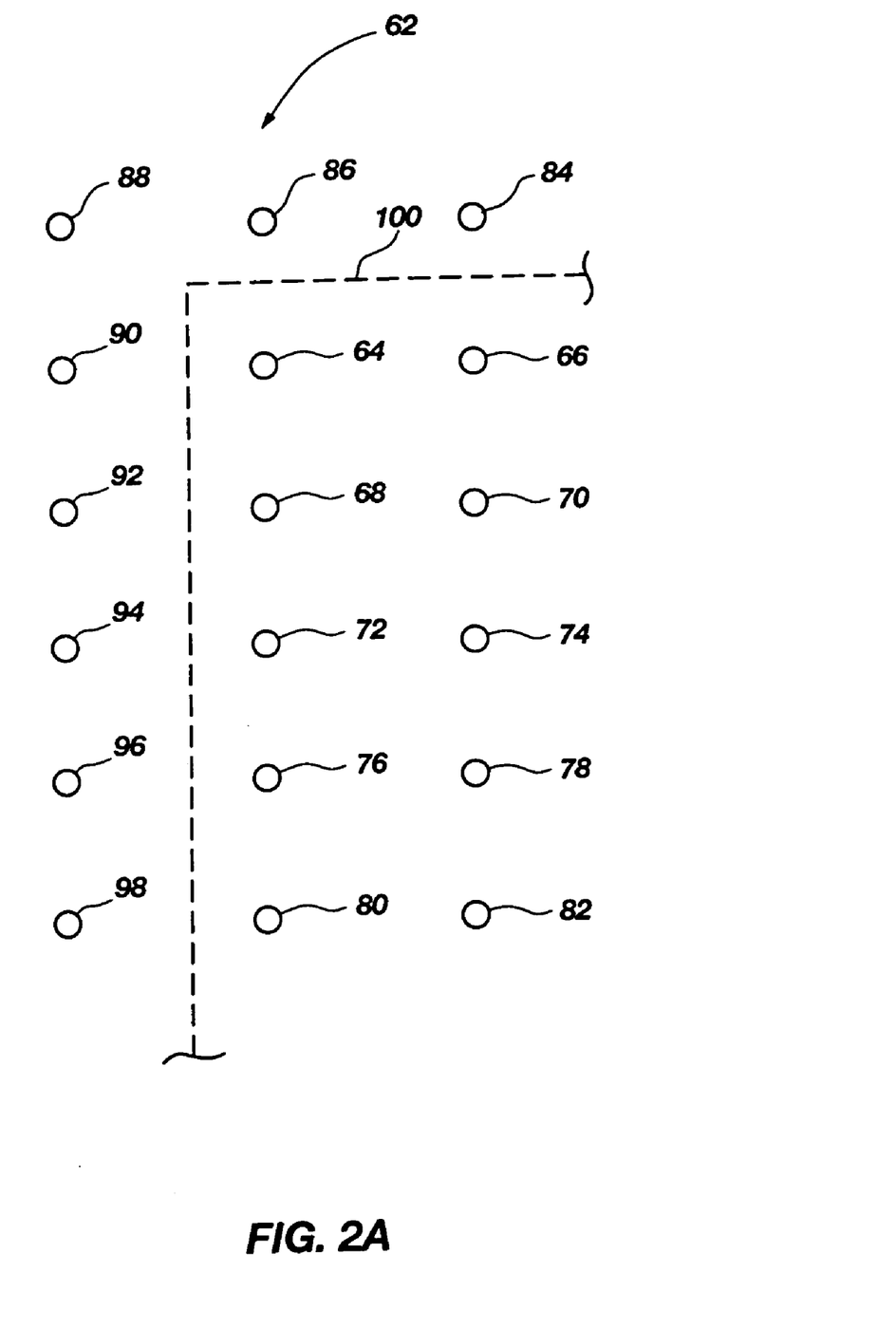
FIGS. 2A and 2B illustrate arrays of contact pads, configured in accordance with embodiments of the present invention.

FIGS. 2A and 2B illustrate exemplary contact pad arrangements, in accordance with embodiments of the present invention. In FIG. 2A, an array of contact pads 62 includes a group of active contact pads 64–82 configured on a PCB for coupling with corresponding pins of an integrated circuit device. For clarity, the corresponding capacitances associated with each of the active contact pads 64–82 are not illustrated; however, they are consistent with the capacitances illustrated in FIG. 1. Array of contact pads 62, in accordance with one embodiment of the present invention, further includes an arrangement of inactive contact pads 84–98, separated by a hypothetical boundary illustrated as dashed line 100. Inactive contact pads 84–98 create an electrical extension of the array of active contact pads, for purposes of consistency in the characterization process, and are further fabricated using techniques and processes reusable and consistent with the formation of active contact pads 64–82.

Figure 2B:
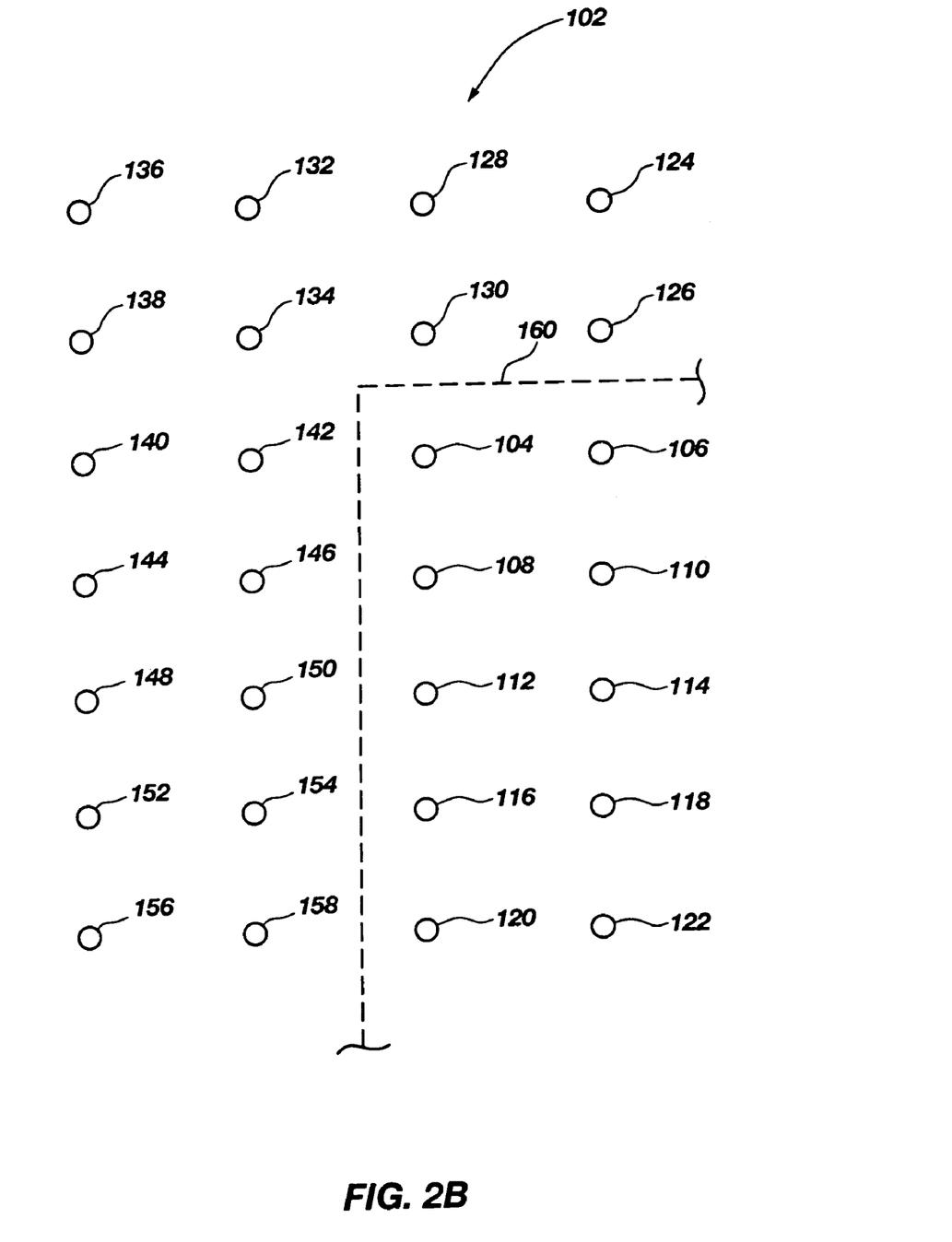

FIG. 2B illustrates another exemplary arrangement of an array of contact pads, in accordance with another embodiment of the present invention. An array of contact pads 102 includes an arrangement of active contact pads 104–122 and inactive contact pads 124–158 forming an extension of the arrangement of the active contact pads, illustrated as being separated by a hypothetical boundary illustrated as dashed line 160. In the present embodiment, the geometry of the contact pads is further extended to simulate a more consistent arrangement and present more consistent impedance characteristics to each of the active contact pads, thereby allowing a more consistent calculation of the impedance contributions of each active contact pad between the integrated circuit device and the test equipment.

Figure 3:
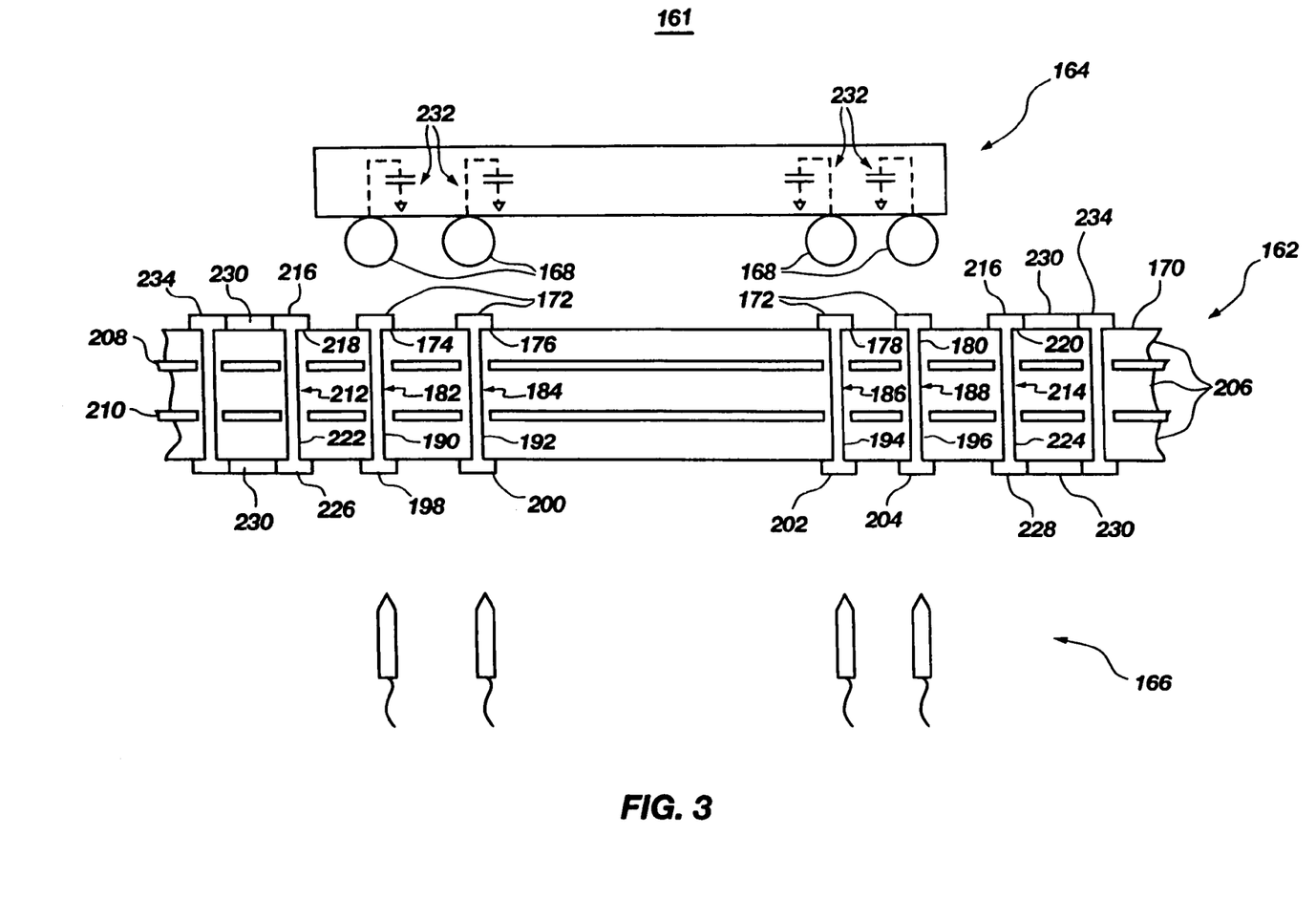
FIG. 3 is a cross-sectional diagram of a printed circuit board configured for testing an integrated circuit device, in accordance with an embodiment of the present invention.

FIG. 3 illustrates a test system 161 including a printed circuit board (PCB) 162 for providing the coupling interface between an integrated circuit device 164 and characterization test equipment 166. While various packaging embodiments for an integrated circuit device are contemplated, for illustrative purposes the present illustration depicts the integrated circuit device as including a Ball Grid Array (BGA) contact pin interface and one or more integrated circuits. Integrated circuit device 164 includes a BGA of active contact pins 168 configured for making electrical connection to the integrated circuits (not shown) within integrated circuit device 164.

PCB 162 includes a top or first side 170 having a corresponding array of active contact pads 172 wherein the configuration and dimension of the array of active contact pads 172 include active contact pads 174–180. The location of each of active contact pads 174–180 corresponds to and is configured to make contact with a corresponding active contact pin 168 of integrated circuit device 164. PCB 162 may be configured as a typical multilayer circuit board, the general configuration and materials of which are known to those of ordinary skill in the art. PCB 162 further includes active test contacts 182–188 for coupling the active contact pins 168 with the corresponding probes or contacts of test equipment 166. Active test contacts 182–188 include, in addition to active contact pads 174–180, active contact vias 190–196 which are further in electrical communication with active test pads 198–204. PCB 162 includes various dielectric layers 206 and interior conductive layers 208 and 210, an example of which includes conductive layers for VDD, VDDQ, GND or other signals. The presently illustrated number of layers is exemplary and variations in layer quantity, structure and composition are also contemplated within the scope of the present invention.

PCB 162, in accordance with an embodiment of the present invention, further includes inactive test contacts 212 and 214 forming an array of inactive contact pads 216 configured and fabricated as an extension to the array of active contact pads 172. Each of inactive test contacts 212 and 214 includes an inactive contact pad 218 and 220, respectively, and inactive contact vias 222 and 224 further coupled to inactive test pads 226 and 228. Inactive test contacts 212 and 214 are electrically coupled to a reference potential through a reference potential conductor 230 internally or on one or both sides of PCB 162. By coupling inactive test contacts to a reference potential, the capacitance presented to an active test contact on the periphery of integrated circuit device 164 more closely approximates the capacitance as seen at an interior active test contact 182–188 when the internal capacitances 232 are electrically coupled with the active test contacts 182–188 and the integrated circuit device 164 undergoes characterization.

In yet another embodiment of the present invention, a second level of inactive test pads 234 may further extend the electrical-consistency footprint of the array of active contact pads 172 to provide even more uniform impedance characteristics to active contact pins 168 at the periphery of integrated circuit device 164.

Figure 4:
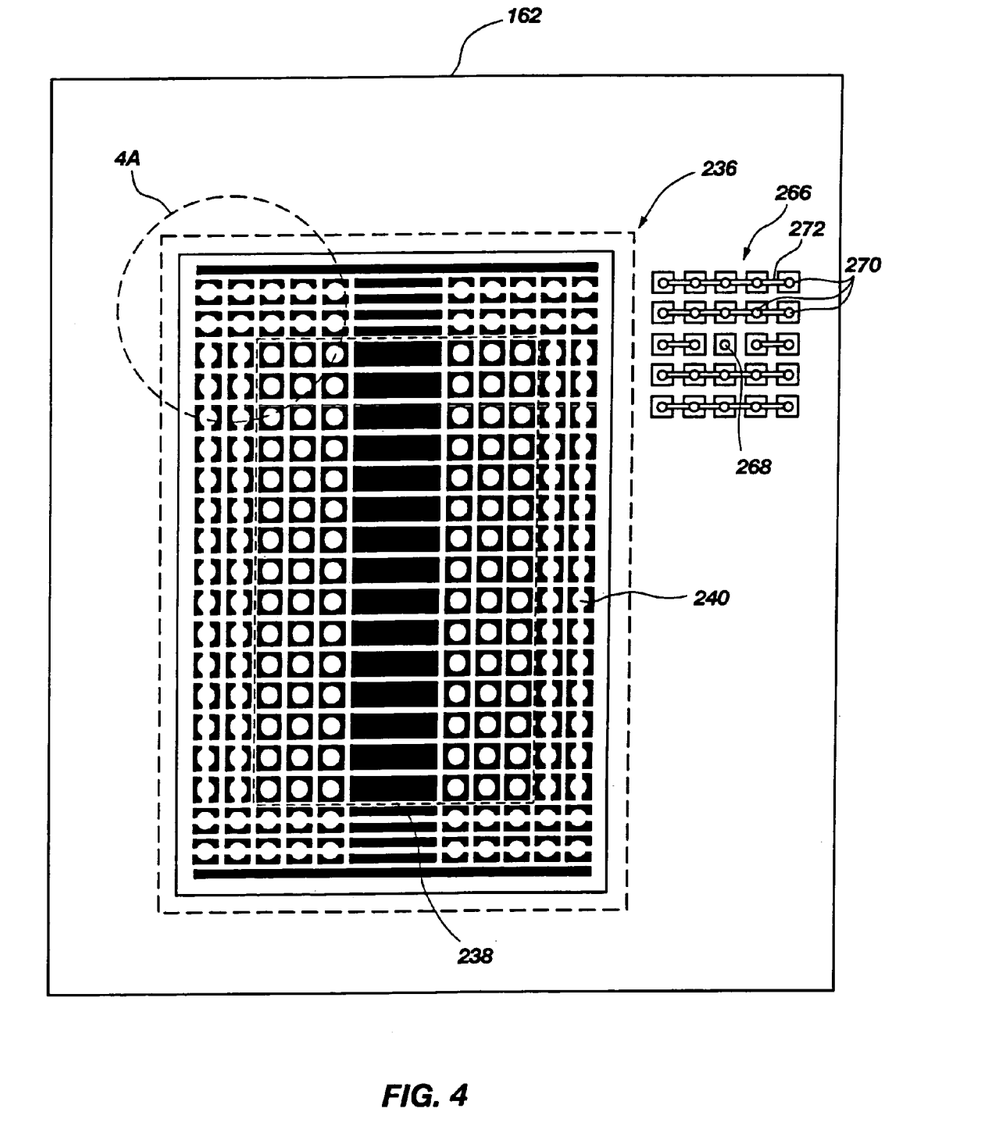
FIGS. 4 and 4A are plan views of a device-side of a PCB configured for characterizing an integrated circuit device, in accordance with an embodiment of the present invention.
Figure 4A:
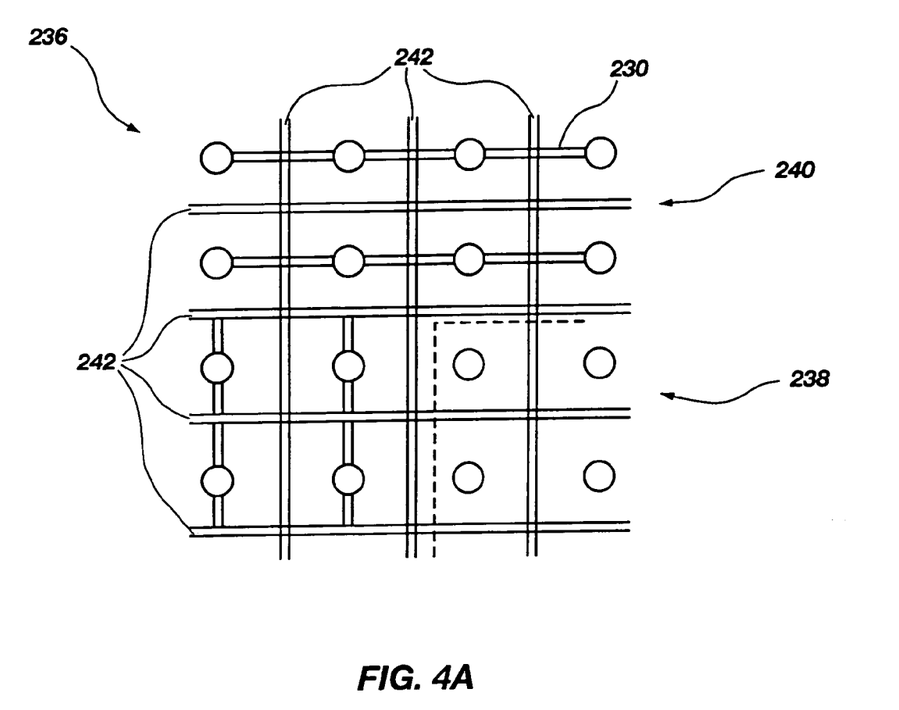

FIG. 4 is a plan view of the top or first side 170 (see FIG. 3) of a PCB 162, in accordance with an embodiment of the present invention. By way of example and not limitation, array of contact pads 236 is configured to receive a 90-pin BGA integrated circuit device for testing and characterization. Array of contact pads 236 is partitioned into a first group of active contact pads 238 and a second group of inactive contact pads 240. It should be noted that inactive contact pads 240 are coupled to reference potential conductors 230, illustrated in FIG. 4A. In the present embodiment, array of contact pads 236, both inactive and active portions, includes a reference potential grid 242 which is coupled to the individual pads of an array of inactive contact pads 240 by way of reference potential conductors 230.

FIG. 4 further illustrates another embodiment of the present invention wherein a test coupon 266 is configured with an active test contact pad 268 surrounded by a corresponding number of inactive test contact pads 270 coupled to a reference potential by way of a reference potential conductor, one of which is illustrated as reference potential conductor 272. Test coupon 266 allows characterization of the intrinsic capacitance and inductance of the specific structure and layout of the array of conductive pads used for characterizing the integrated circuit.

Figure 5:
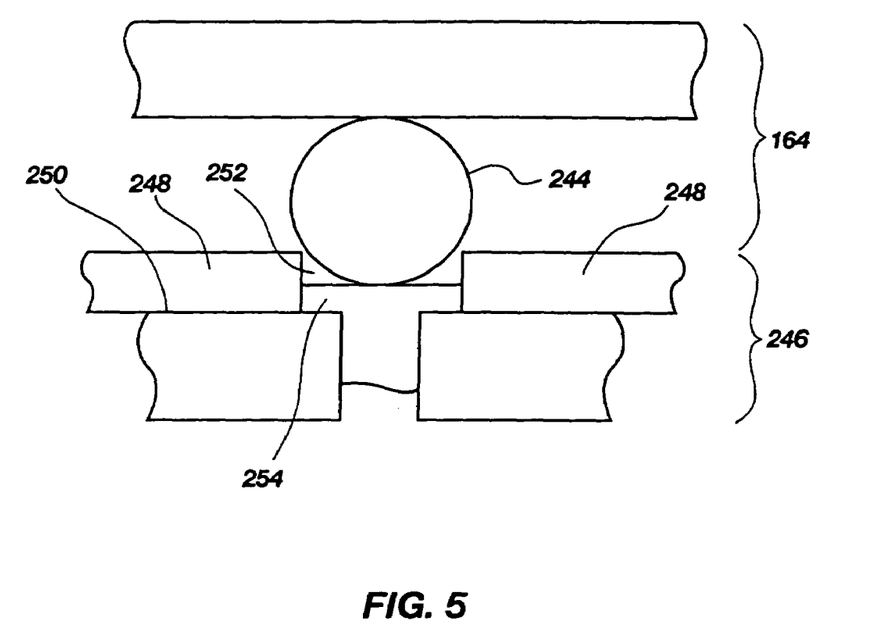
FIG. 5 is a detailed cross-sectional diagram of an alignment structure for improving repeatability of alignment of an integrated circuit device with a PCB during characterization of the device, in accordance with an embodiment of the present invention.

FIG. 5 is a cross-sectional diagram of an alignment structure for improving the testability of integrated circuit devices, in accordance with an embodiment of the present invention. In the present embodiment, one contact, illustrated as a BGA contact 244, exhibits an improved alignment with PCB 246 through the utilization of a solder mask 248 as applied to the top or first surface 250 of PCB 246. As shown, solder mask 248 substantially covers the first surface 250 of PCB 246 and includes via openings 252 to the active contact pad 254. In the present embodiment, solder mask 248 provides a steeper profile for facilitating an improved alignment of BGA contact 244 onto active contact pad 254. By way of example and not limitation, solder mask 248 may be a dry solder mask or of another form configured to provide an improved alignment of various integrated circuit devices by reducing coupling misalignment during the coupling of an integrated circuit device to a PCB.

Figure 6:
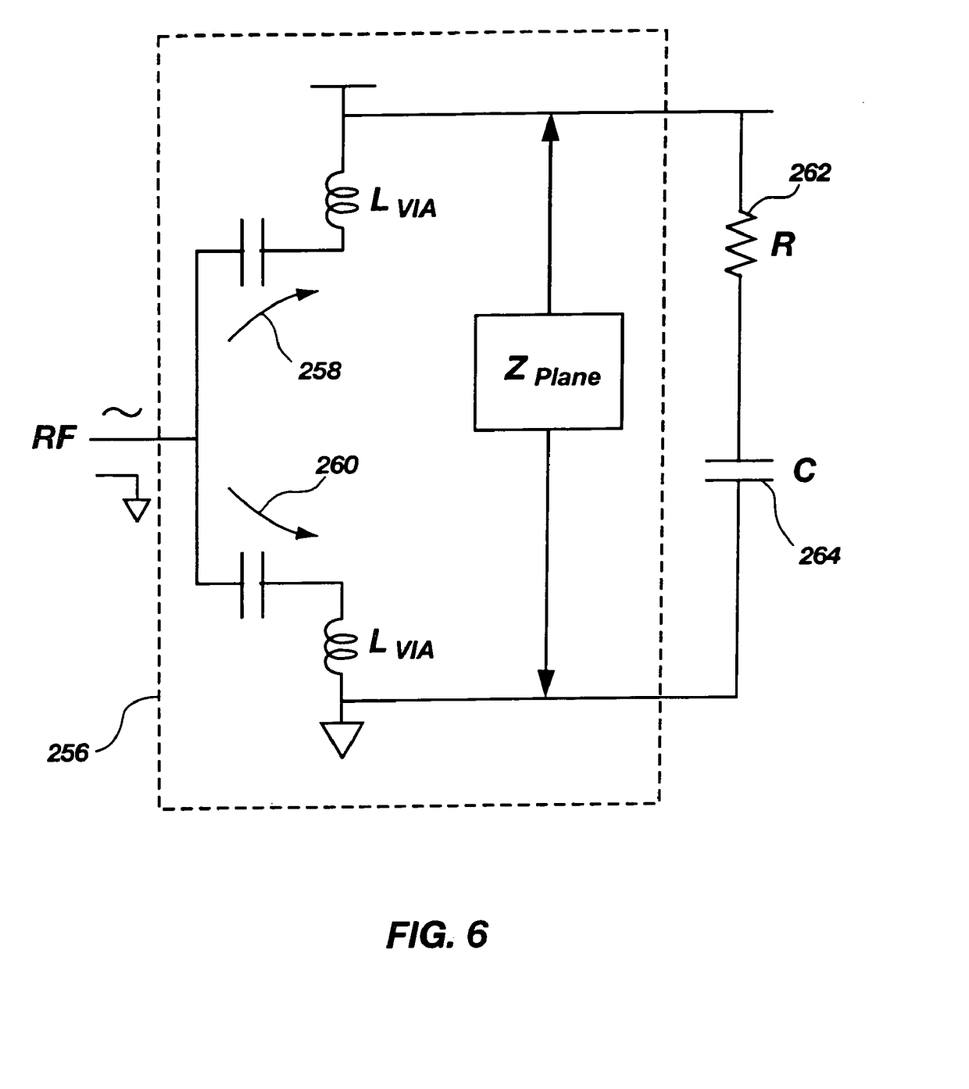
FIG. 6 is a circuit diagram including an electrical circuit for reducing the inserted impedance between an integrated circuit device-under-characterization and associated test equipment, in accordance with an embodiment of the present invention.

FIG. 6 illustrates compensating componentry which further standardizes impedance inserted between an integrated circuit device and a tester during characterization of an integrated circuit device. It is appreciated in the testing environment that once test signals reach a certain frequency, inductance within the PCB begins to contribute to the measured impedance between an integrated circuit device and test equipment. For illustrative purposes, FIG. 6 depicts a typical inverter input 256 of an integrated circuit device. During testing of an integrated circuit device, an RF input signal may be applied by test equipment at inverter input 256 with the RF input signal passing through capacitor paths 258 and 260, resulting in a series-coupled impedance of a capacitor and an inductor in each path which causes an increased impedance. For impedance characterization purposes, it is desirable to clamp the impedance introduced by the PCB structure during high frequency testing. In yet another embodiment of the present invention, a series-configured resistor 262 and a capacitor 264 are coupled between the power signals and the ground signal to counteract the effects of the inductance of the PCB during high frequency testing of the integrated circuit device.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. An array of test contacts on a printed circuit board, comprising:
   an active portion of the array of test contacts on the printed circuit board configured for directly coupling with a corresponding plurality of pins on an integrated circuit device; and
   an inactive portion of the array of test contacts on the printed circuit board configured to be directly uncouplable with any of the plurality of pins on the integrated circuit device and further electrically coupled to a reference signal on the printed circuit board.

2. The array of test contacts of claim 1, wherein the inactive portion includes a first array of test contacts adjacent to an array of test contacts of the active portion.

3. The array of test contacts of claim 2, wherein the inactive portion further comprises a second array of test contacts configured adjacent to the first array of test contacts.

4. The array of test contacts of claim 1, wherein the active portion is configured for coupling with a corresponding plurality of pins on an integrated circuit device and the inactive portion is configured adjacent to the active portion on a periphery of the printed circuit board.

5. The array of test contacts of claim 4, wherein the inactive portion is arranged adjacent to at least one test contact of the active portion surrounded by fewer than four other test contacts from the active portion.

6. The array of test contacts of claim 5, wherein the inactive portion of the array of test contacts further includes at least one additional row of test contacts within the inactive portion arranged adjacent to ones of the test contacts in the inactive portion that are adjacent to the test contacts of the active portion.

7. The array of test contacts of claim 1, further comprising a test coupon portion of test contacts, the test coupon portion including at least one active test contact surrounded by a plurality of inactive test contacts configured for measuring at least one signal characteristic between the at least one active test contact and the plurality of inactive test contacts, the test coupon portion arranged substantially similar to the array of test contacts of the active and inactive portions.

* * * * *